(12) United States Patent
Koganei

(10) Patent No.: US 7,243,280 B2
(45) Date of Patent: Jul. 10, 2007

(54) SEMICONDUCTOR CIRCUIT APPARATUS AND TEST METHOD THEREOF

(75) Inventor: Ryoji Koganei, Tokyo (JP)

(73) Assignee: Sony Corporation, Tokyo (JP)

( * ) Notice: Subject to any disclaimer, the term of this patent is extended or adjusted under 35 U.S.C. 154(b) by 243 days.

(21) Appl. No.: 10/918,497

(22) Filed: Aug. 13, 2004

(65) Prior Publication Data

US 2005/0050412 A1 Mar. 3, 2005

(30) Foreign Application Priority Data

Aug. 19, 2003 (JP) ............... 2003-295046

(51) Int. Cl.
*G01R 31/3183* (2006.01)
*G01R 31/3185* (2006.01)

(52) U.S. Cl. ..................... 714/726; 714/724

(58) Field of Classification Search ........... 714/726, 714/727, 729, 724; 326/16, 21
See application file for complete search history.

(56) References Cited

U.S. PATENT DOCUMENTS

| 5,519,714 | A | | 5/1996 | Nakamura et al. |
| 5,774,702 | A | * | 6/1998 | Mitsuishi et al. ........... 713/501 |
| 5,848,075 | A | * | 12/1998 | Katayama et al. .......... 714/726 |
| 5,918,003 | A | | 6/1999 | Koch et al. |
| 2002/0112199 | A1 | | 8/2002 | Whetsel |

FOREIGN PATENT DOCUMENTS

JP 2002-323540 8/2002

\* cited by examiner

*Primary Examiner*—Albert Decady
*Assistant Examiner*—Dipakkumar Gandhi
(74) *Attorney, Agent, or Firm*—Robert J. Depke; Rockey, Depke, Lyons & Kitzinger LLC.

(57) ABSTRACT

In a semiconductor circuit apparatus and its test method according to embodiments of the present invention, the clock enable control circuit can generate in a test mode an enable clock signal by using the substitute enable signal instead of the enable signal output from the enable signal generation combinational circuit and supplies it to the enable input terminal of the sequential circuit. Accordingly, with the simple structure in which the substitute enable signal is used, a proper enable clock signal can be generated and a scan test can be performed by reliably setting the sequential circuit to the enable state.

9 Claims, 3 Drawing Sheets

F I G. 5
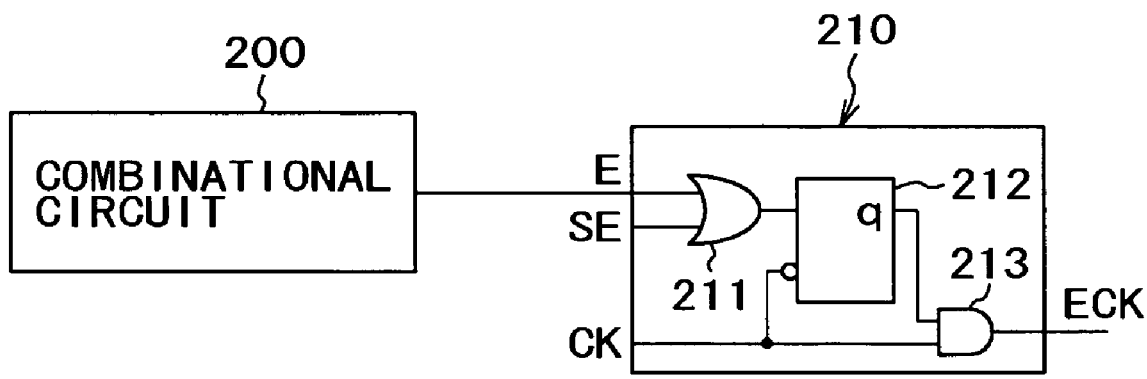

SEMICONDUCTOR CIRCUIT APPARATUS AND TEST METHOD THEREOF

CROSS REFERENCES TO RELATED APPLICATIONS

The present invention claims priority to its priority document No. 2003-295046 filed in the Japanese Patent Office on Aug. 19, 2003, the entire contents of which being incorporated by reference herein.

BACKGROUND OF THE INVENTION

1. Field of the Invention

The present invention relates to a semiconductor circuit apparatus and its test method, the semiconductor circuit apparatus having a plurality of combinational circuits for executing various logical calculations and sequential circuits such as flip-flops for executing a full scan test to test functionalities of the combinational circuits.

2. Description of Related Art

Various techniques have been proposed to detect defects of a variety of LSI's (e.g., refer to Japanese Patent Publication No. 2628154, Japanese Patent Laid-open Publication No. H10-123223). As one of these methods, an ATPG (automatic test pattern generation) method is known, which uses a full scan test by flowing a predetermined test pattern to all flip-flops in a circuit under the conditions that the flip-flops can be controlled and the outputs thereof can be observed, thereby observing the operation result of each logical circuit.

With this method, however, if the number of measurement points is increased in order to improve a defect detection rate, the number of flip-flops for the measurement purposes and the number of external terminals for output observation are required to be increased, resulting in a bulky scale caused by a complicated structure and an increased circuit space.

In the following description, a circuit for executing a logical calculation of an input value and outputting a unique output value is called a "combinational circuit" as its generic concept, and a circuit such as a flip-flop including a time sequential transition operation is called a "sequential circuit" as its generic concept.

It is desired for recent LSI's to adopt the mechanism of stopping an unnecessary clock in order to reduce a consumption power. For this structure, more complicated logical circuits are combined to finely control the supply/stop of the clock by using a clock enable signal.

The above-described ATPG method using the full scan test performs two operations, a shift operation of flowing a test pattern to each flip-flop and a capture operation of finding an actual detect in the state that logical circuits perform a normal operation. In the shift operation, it is designed such that a clock is always input to each flip-flop to be scanned, whereas in the capture operation, a clock line is not controlled at all, but the clock is controlled only by a test pattern to be flowed in the shift operation.

However, if the clock line is provided with a complicated circuit for controlling clock enable in order to reduce a consumption power as described above, it is necessary to form a test pattern by considering logic of both a test pattern for supplying a clock and a test pattern for identifying a detect. This results in drawbacks such as complicated test patterns, the increased number of defects unable to be properly detected, and a longer time to prepare the test pattern, thereby causing decrease in efficiency in circuit design and increase of production cost.

FIG. 4 is a block diagram showing an example of the structure of an LSI circuit having control circuits for the above-described clock enable (so-called clock enablers).

In this figure, a combinational circuit 110 is a circuit made of a logical circuit group for executing predetermined logical calculations. Input and output stages of the combinational circuit are provided with flip-flops 121, 122, 123 and 124 and selectors 131, 132, 133 and 134 for selecting data input to the respective flip-flops 121, 122, 123 and 124 between a normal mode and a test mode. By switching the selectors 131, 132, 133 and 134, for example, data transfer is possible without passing through the combinational circuit 110 to and from the respective flip-flops 121, 122, 123 and 124.

Combinational circuits 141, 142, 143 and 144 are provided at the input stages of the flip-flops 121, 122, 123 and 124 to generate enable signals for the flip-flops 121, 122, 123 and 124. Clock enablers 151, 152, 153 and 154 are provided at the output stages of the combinational circuits 141, 142, 143 and 144 to control supply/stop of a clock to the flip-flops 121, 122, 123 and 124.

The combinational circuits 142 and clock enabler 152 control the flip-flops 121 and 122 at the input stage of the combinational circuit 110, and the combinational circuit 141 and clock enabler 151 control another flop-flop 125.

The combinational circuits 143 and 144 and clock enablers 153 and 154 are an example of a multi-stage circuit for controlling the flip-flops 123 and 124 at the output stage of the combinational circuit 110.

FIG. 5 is a block diagram showing a clock enabler to be used with the circuit shown in FIG. 4.

A clock enabler 210 is disposed between a combinational circuit 200 for generating an enable signal and a flip-flop (omitted in FIG. 5) for scan test. The clock enabler 210 is constituted of an OR circuit 211, a latch circuit 212 and an AND circuit 213. The OR circuit 211 generates an OR between an enable signal E output from the combinational circuit 200 and a shift scan control signal SE which is a timing signal in the shift operation. The latch circuit 212 latches an output signal from the OR circuit 211. The AND circuit 213 generates an AND between an output of the latch circuit 212 and a clock signal CK, as an enable clock signal ECK which is supplied to the enable input terminal of the flop-flop.

SUMMARY OF THE PRESENT INVENTION

However, in the clock enabler having the structure shown in FIG. 5, if the structure of the enable signal generating circuit is complicated, there arises a drawback such that the test pattern for the capture operation becomes complicated so that the flip-flop cannot properly capture data in response to the enable clock signal ECK in some cases, thereby hindering performance of a correct test.

Accordingly, it is desirable to provide a semiconductor circuit apparatus and its test method, capable of performing a scan test using a sequential circuit, properly and with a simple structure, even in the circuit arrangement which suppresses power consumption by providing a clock line with a combinational circuit for enable generation, and capable of realizing efficient circuit design and reduced production cost. The present invention is made in view of the above-described drawbacks.

A semiconductor circuit apparatus according to an embodiment of the present invention has: a plurality of combinational circuits for executing predetermined logical calculations; a plurality of sequential circuits disposed at output or input stages of the combinational circuits, the sequential circuits switching between output or input lines of the combinational circuits depending upon a normal mode and a test mode of the combinational circuits, and executing in the test mode a shift operation of supplying test data to the combinational circuits and a capture operation of capturing each test result from the combinational circuits; and a clock enable control circuit provided at the output stage of each enable signal generation combinational circuit, among the plurality of combinational circuits, for supplying an enable signal to a corresponding one of the sequential circuits, the clock enable control circuit controlling whether the enable signal output from the enable signal generation combinational circuit is supplied to an enable terminal of the corresponding one of the sequential circuits.

The clock enable control circuit is characterized by including a first OR circuit for generating an OR between an enable signal output from the enable signal generation combinational circuit and a substitute enable signal substituting for the enable signal, a latch circuit for latching an output signal from the first OR circuit and an AND circuit for generating an AND between an output of the latch circuit and the clock signal and supplying the AND to the enable input terminal of the corresponding one of the sequential circuits.

A test method according to an embodiment of the present invention is a test method for a semiconductor circuit apparatus which has: a plurality of combinational circuits for executing predetermined logical calculations; a plurality of sequential circuits disposed at output or input stages of the combinational circuits, the sequential circuits switching between output or input lines of the combinational circuits depending upon a normal mode and a test mode of the combinational circuits, and executing in the test mode a shift operation of supplying test data to the combinational circuits and a capture operation of capturing each test result from the combinational circuits; and a clock enable control circuit provided at the output stage of each enable signal generation combinational circuit, among the plurality of combinational circuits, for supplying an enable signal to a corresponding one of the sequential circuits, the clock enable control circuit controlling whether the enable signal output from the enable signal generation combinational circuit is supplied to an enable terminal of the corresponding one of the sequential circuits.

According to the semiconductor circuit apparatus and its test method according to the embodiments of the present invention, the clock enable control circuit can generate in a test mode an enable clock signal by using the substitute enable signal instead of the enable signal output from the enable signal generation combinational circuit and supplies it to the enable input terminal of the sequential circuit. Accordingly, with the simple structure that the substitute enable signal is used, a proper enable clock signal can be generated and a scan test can be performed by reliably setting the sequential circuit to the enable state.

Accordingly, even in the circuit arrangement that power consumption is suppressed by providing a clock line with the enable generation combinational circuit, a scan test using the sequential circuit can be performed properly with the simple structure and the effects of realizing efficient circuit design and product cost reduction are provided.

BRIEF DESCRIPTION OF THE DRAWINGS

The above and other objects, features and advantages of the present invention will become more apparent from the following description of the presently preferred exemplary embodiment of the invention taken in conjunction with the accompanying drawing, in which:

FIG. 5 is a block diagram showing the structure of a clock enabler disposed in the LSI circuit shown in FIG. 4.

DETAILED DESCRIPTION OF THE EMBODIMENTS

According to an embodiment, in a structure such that a clock line of a semiconductor circuit apparatus is provided with an enable signal generation combinational circuit and a clock enable control circuit and that the enable input terminal of a flip-flop for a scan test is controlled, the clock enable control circuit is provided with an OR circuit A for generating an OR between an enable signal output from the enable signal generation combinational circuit and a substitute enable signal substituting for the enable signal in a test mode, an OR circuit B for generating an OR between an output signal of the OR circuit A and a shift scan signal for controlling a shift operation of the flip-flop in the test mode, a latch circuit for latching an output signal of the OR circuit B, and an AND circuit for generating an AND between an output of the latch circuit and a clock signal and supplying it to the enable input terminal of the flip-flop as an enable clock signal.

Even in the structure that the original enable signal cannot be generated easily in the test mode because of the complicated structure of the enable signal generation combinational circuit, the scan test can be performed easily and reliably by using the substitute enable signal which is active continuously during the test mode. It is therefore possible to easily form a test pattern and greatly improve a work efficiency.

A flip-flop for performing the capture operation of capturing a test result from the enable signal generation combinational circuit may be disposed at the output stage of the enable signal generation combinational circuit. It is therefore possible to test the enable signal generation combinational circuit singularly with ease.

Further, a direct select circuit may be provided which turns on and off the substitute enable signal to be input to the OR circuit A based on an external control input. It is therefore possible to perform a test without using the substitute enable signal and realize a versatile and fine test.

First Embodiment

Figure 1:
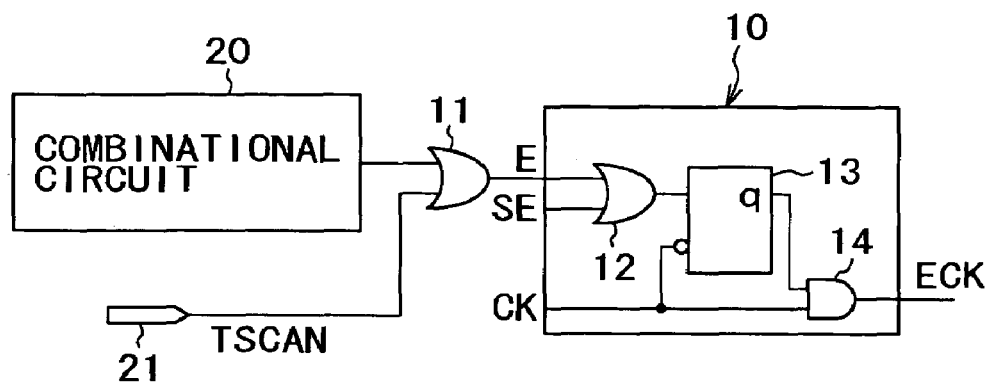
FIG. 1 is a block diagram showing the structure of a clock enabler of an LSI circuit according to a first embodiment of the present invention.
Figure 4:
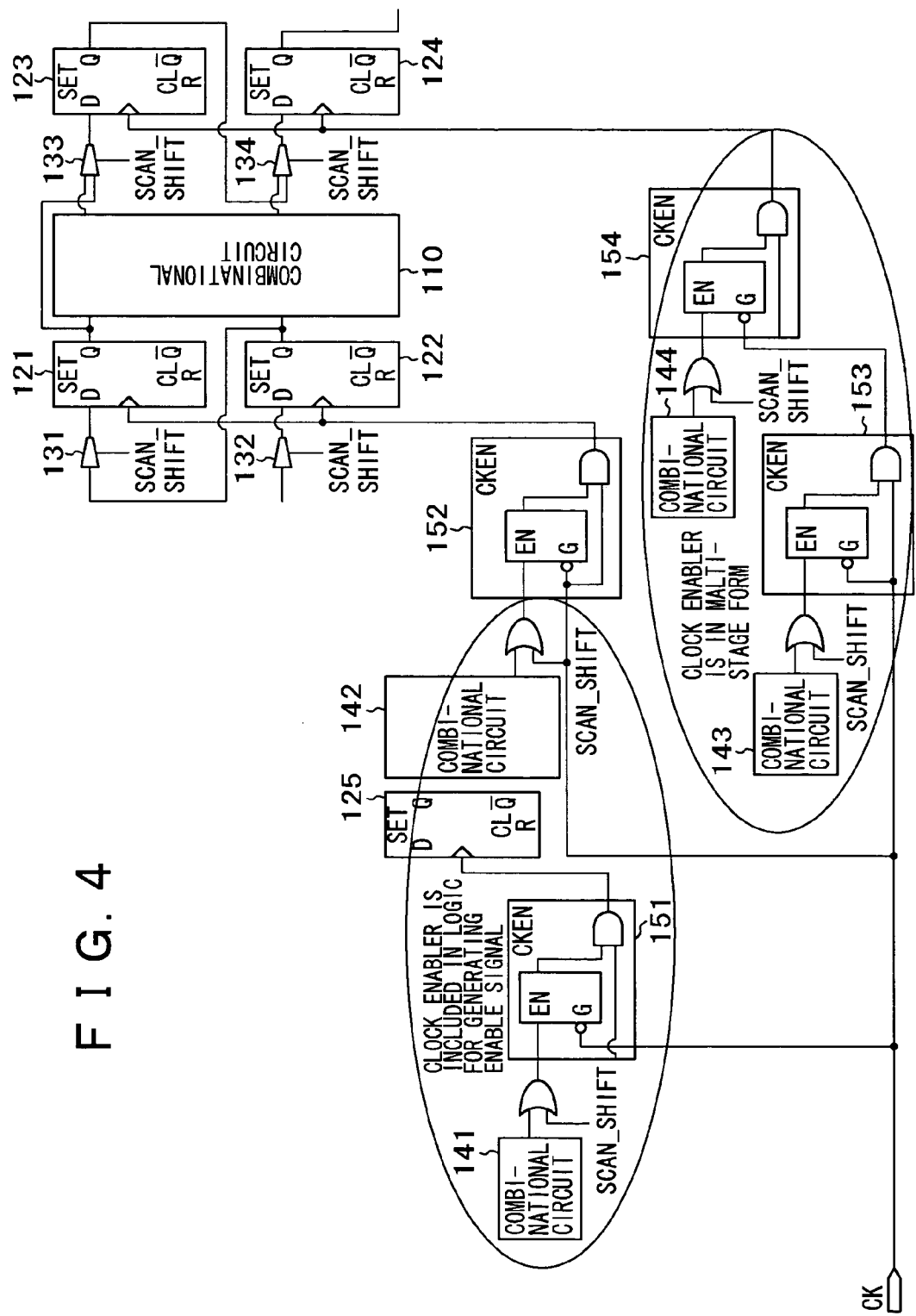
FIG. 4 is a block diagram showing an example of the structure of a LSI circuit in related art for a full scan test and clock line control.

FIG. 1 is a block diagram showing the structure of a clock enabler to be used with an LSI circuit according to the first embodiment of the present invention. The structure of the LSI circuit of this embodiment is assumed to be similar to, for example, that shown in FIG. 4, and an enabler 10 of this embodiment is assumed to be disposed at positions similar to, for example, those of the clock enablers 151, 152, 153 and 154.

As shown in FIG. 1, the clock enabler 10 of the embodiment is disposed between a combinational circuit 20 for generating an enable signal and a flip-flop (omitted in FIG. 1) for a scan test, and has OR circuits 11 and 12, a latch circuit 13 and an AND circuit 14.

The OR circuit 11 is a first OR circuit which generates an OR of input signals, an enable signal E output from the combinational circuit 20 and a test scan signal TSCAN input from the test control terminal 21, and outputs the OR. The test scan signal TSCAN is a substitute enable signal which is active (on) continuously during a test period, and an output of the OR circuit is fixed to on (=1) during the test period.

The OR circuit 12 is a second OR circuit which generates an OR between an OR signal output from the OR circuit 11 and a shift scan control signal SE as a timing signal during the shift operation, and outputs the OR.

The latch circuit 13 latches an output signal from the OR circuit 12. The AND circuit 14 generates an AND between an output of the latch circuit 13 and a clock signal CK, as an enable clock signal ECK which is supplied to an enable terminal of the flip-flop.

The clock enabler 10 of this type enables the flip-flop irrespective of the state of the combinational circuit 20, because the test scan signal TSCAN is on during the test period. It is therefore possible to execute a proper test operation. Even if the structure of the combinational circuit 20 is complicated, an effective scan test can therefore be performed with a relatively simple test pattern.

During the normal operation, the flip-flop can be controlled by the enable signal E output from the combinational circuit 20 because the test scan signal TSCAN is off. It is therefore possible to effectively perform an operation of reducing a consumption power by stopping a clock line.

Second Embodiment

Figure 2:
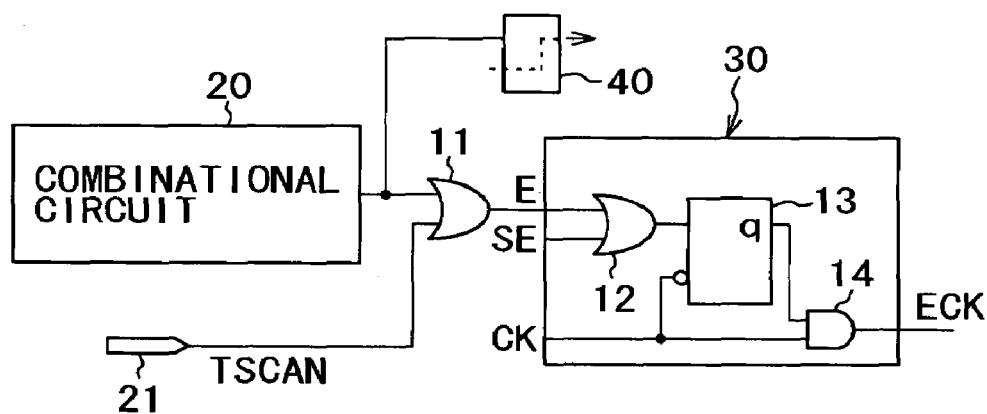
FIG. 2 is a block diagram showing the structure of a clock enabler of an LSI circuit according to a second embodiment of the present invention.

FIG. 2 is a block diagram showing a structure of a clock enabler to be used with an LSI circuit according to the second embodiment of the present invention. In FIG. 2, common constituent elements to those shown in FIG. 1 are represented by identical reference symbols for the following description. The structure of the LSI circuit of this embodiment is also assumed to be similar to, for example, that shown in FIG. 4, and an enabler 30 of this embodiment is assumed to be disposed at positions similar to, for example, those of the clock enablers 151, 152, 153 and 154.

The clock enabler 10 of the first embodiment shown in FIG. 1 is difficult to perform singularly a test for the enable signal generation combinational circuit 20. In the clock enabler 30 of the second embodiment, an output terminal of the combinational circuit 20 is singularly connected to a data input terminal of a flip-flop 40 for scan test, and the test pattern is transferred to a scan chain after this flip-flop 40, to thereby allow the scan test to monitor an individual test for the combinational circuit 23.

Other structures are similar to those of the first embodiment shown in FIG. 1, and so the description thereof is omitted.

Third Embodiment

Figure 3:
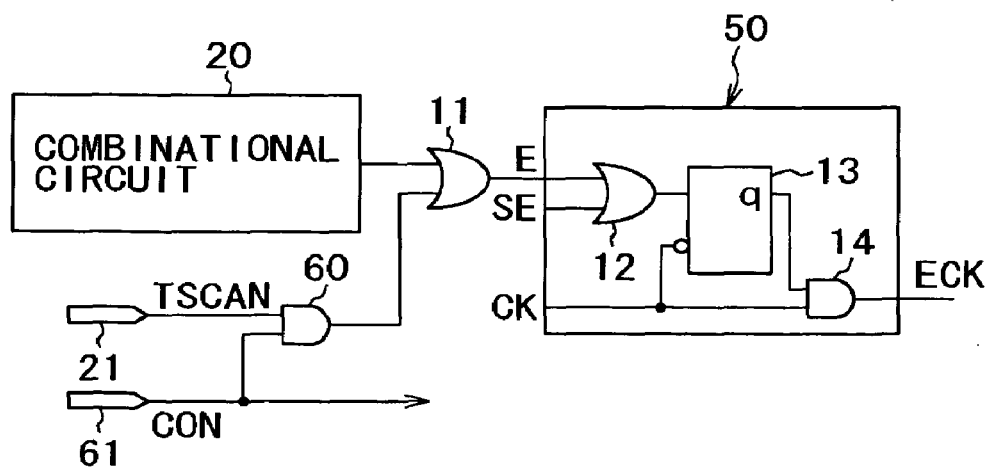
FIG. 3 is a block diagram showing the structure of a clock enabler of an LSI circuit according to a third embodiment of the present invention.

FIG. 3 is a block diagram showing a structure of a clock enabler to be used with an LSI circuit according to the third embodiment of the present invention. In FIG. 3, common constituent elements to those shown in FIG. 1 are represented by identical reference symbols for the following description. The structure of the LSI circuit of this embodiment is also assumed to be similar to, for example, that shown in FIG. 4, and an enabler 50 of this embodiment is assumed to be disposed at positions similar to, for example, those of the clock enablers 151, 152, 153 and 154.

Although the clock enabler 30 of the second embodiment shown in FIG. 2 can singularly test the enable signal generation combinational circuit 20, it is necessary to provide the flip-flop 40, which has the disadvantages of a complicated structure, a layout space and the like. Furthermore, since the enable logic of the substitute enable signal during the test is fixed to "1", it is impossible to observe the operation in the state of the enable logic of "0".

In the third embodiment, therefore, an AND circuit 60 is provided as a direct select circuit capable of properly turning on and off the test scan signal TSCAN (test control terminal 21) as the substitute enable signal in response to an external control input CON (control terminal 61). The AND circuit 60 generates an AND between the test scan signal TSCAN and external control input CON and supplies it to the OR circuit 11.

It is therefore possible to execute a test in the state that the substitute enable signal (test scan signal TSCAN) is off. For example, a test pattern for perfectly supplying a clock is generated with the substitute enable signal being turned on (fixed to "1"), and thereafter a test pattern is incrementally formed with the substitute enable signal being turned off (fixed to "0"). It is therefore possible to form a test pattern in the portion of the normal clock enable logic which cannot be observed when the substitute enable signal is fixed to "1" and to increase greatly the number of positions where a defect can be found.

Other structures are similar to those of the first embodiment shown in FIG. 1, and so the description thereof is omitted.

It should be understood by those skilled in the art that various modifications, combinations, sub-combinations and alterations may occur depending on design requirements and other factors insofar as they are within the scope of the appended claims or the equivalents thereof.

What is claimed is:

1. A semiconductor circuit apparatus comprising:
   at least one combinational circuit for executing predetermined logical operations;
   at least one sequential circuit disposed at an output stage of the combinational circuit, and in a test mode supplying test data to the combinational circuit and capturing test results from the combinational circuit; and
   a clock enable control circuit provided at the output stage of the combinational circuit, controlling whether the enable signal is supplied to an enable terminal of the corresponding one of the sequential circuits;
   wherein the clock enable control circuit includes;
   a first OR circuit for generating an OR between an enable signal output from the combinational circuit and a substitute enable signal, wherein an external controller provides the substitute enable signal when operating in a test mode;
   a latch circuit for latching an output signal from the first OR circuit; and
   an AND circuit for generating an AND between an output of the latch circuit and the clock signal and supplying the AND as an enable clock signal.

2. The semiconductor circuit apparatus according to claim 1, wherein the substitute enable signal is a signal that is continuously active during a test mode period.

3. The semiconductor circuit apparatus according to claim 1, wherein the clock enable control circuit includes a second OR circuit that generates an OR between an OR signal output from the first OR circuit and a shift scan control signal, the second OR circuit being disposed between the first OR circuit and a latch circuit, the shift scan signal controlling a shift operation in a test mode period of the sequential circuit.

4. The semiconductor circuit apparatus according to claim 3, further comprising:
a direct select circuit for turning on and off the substitute enable signal to be input to the first OR circuit based on an external control input.

5. The semiconductor circuit apparatus according to claim 1, further comprising:
a sequential circuit, which is disposed between the combinational circuit and the first OR circuit of the clock enable control circuit, for performing a capture operation for capturing a test result from the combinational circuit.

6. A test method for a semiconductor circuit apparatus, the semiconductor circuit apparatus including:
at least one combinational circuit for executing predetermined logical operations;
at least one sequential circuit disposed at an output of the combinational circuit, the sequential circuit in a test mode supplying test data to the combinational circuit and capturing test results from the combinational circuit; and
a clock enable control circuit provided at the output of the combinational circuitcontrolling whether the enable signal is supplied to an enable terminal of the corresponding one of the sequential circuits,
wherein, in a test mode, a substitute enable signal is supplied to an input terminal of the sequential circuit, and further wherein an external controller selectively applies the substitute enable signal during the test mode of operation.

7. The test method for a semiconductor circuit apparatus according to claim 6, wherein the substitute enable signal is a signal that is continuously active during a test mode period.

8. The test method for a semiconductor circuit apparatus according to claim 6, wherein a capture operation is performed for capturing individual test results from the combinational circuit.

9. The test method for a semiconductor circuit apparatus according to claim 6, wherein a test is performed by selecting a first test operation and a second test operation, the first test operation utilizing the substitute enable signal that is turned on and off based on an external control input, the second test operation utilizing an OR signal of an enable signal according to the enable signal generation combinational circuit and a shift scan signal controlling a shift operation in a test mode of the sequential circuit.

* * * * *